United States Patent
Hass et al.

(10) Patent No.: US 6,337,630 B1
(45) Date of Patent: Jan. 8, 2002

(54) APPARATUS AND METHOD FOR DETECTING COOLING CONDITIONS IN A COMPUTER

(75) Inventors: Kenneth Alan Hass, Georgetown; Joel Jonothan Jaramillo, Austin, both of TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 09/510,004

(22) Filed: Feb. 22, 2000

(51) Int. Cl.[7] ............................................... G08B 21/00
(52) U.S. Cl. ...................... 340/606; 340/635; 702/130; 702/132; 764/528.34; 764/528.35; 700/299; 700/300; 361/695; 361/704
(58) Field of Search .................................. 340/606, 635, 340/640, 643, 584; 702/130, 132; 364/528.34, 528.35; 700/299, 300; 361/680, 690, 695, 704

(56) References Cited

U.S. PATENT DOCUMENTS

| | | | |
|---|---|---|---|
| 5,220,522 A | * | 6/1993 | Wilson et al. ............... 708/134 |
| 5,414,591 A | | 5/1995 | Kimura et al. ............... 361/695 |
| 6,032,108 A | * | 2/2000 | Seiple et al. .................. 702/97 |

* cited by examiner

Primary Examiner—Edward Lefkowitz
(74) Attorney, Agent, or Firm—Baker Botts L.L.P.

(57) ABSTRACT

A system and method for using one or more anemometers to detect and regulate unfavorable conditions inside a computer system. The anemometer or anemometers, along with other sensing devices are electronically connected to system management software which alerts the system administrator when the measurements collected from the anemometer and other sensing devices indicate that an unfavorable condition, such as overheating, is affecting one or more components inside the computer system. The apparatus and method thus allows the system administrator to quickly and accurately identify unfavorable conditions inside the computer system in a timely manner.

24 Claims, 2 Drawing Sheets

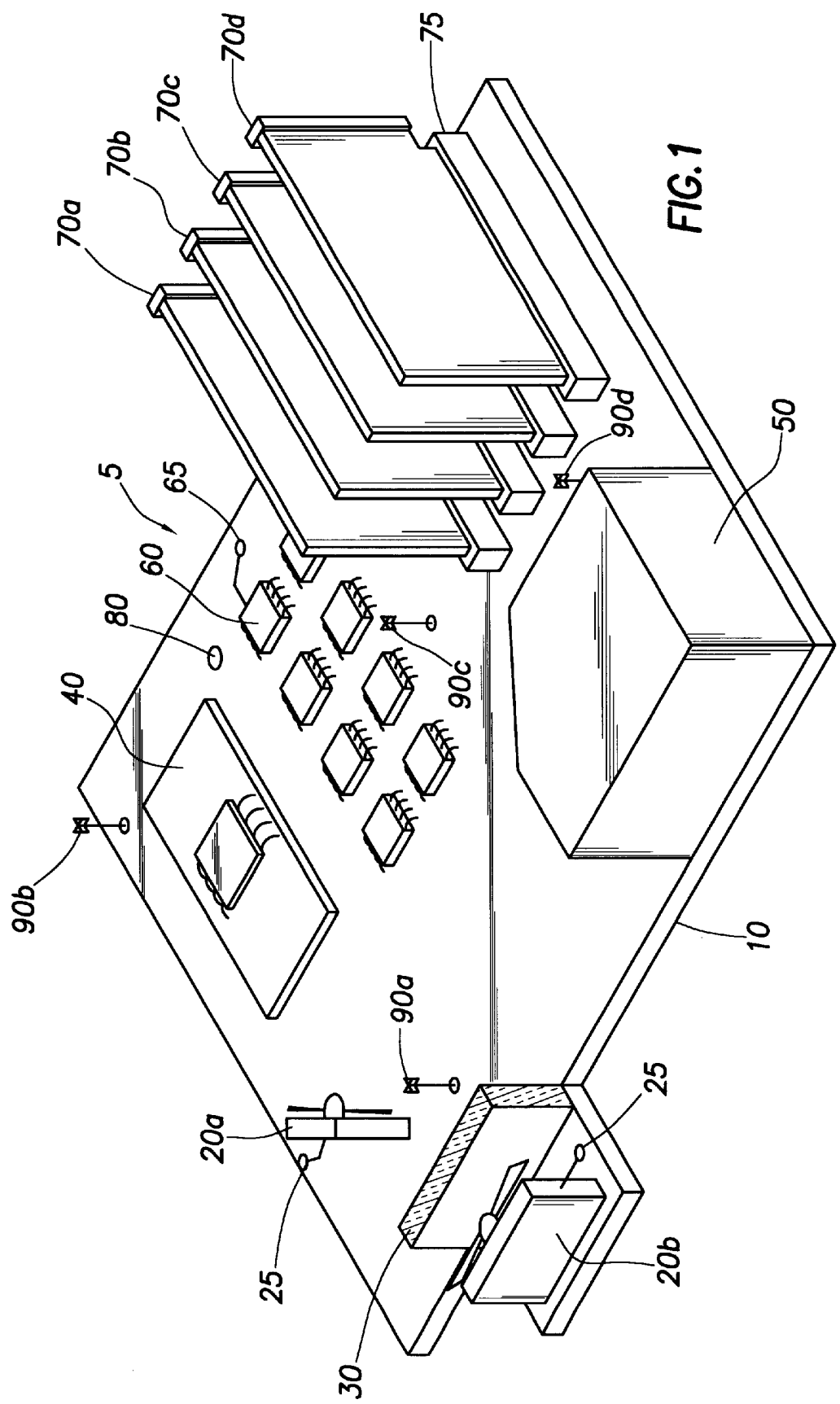

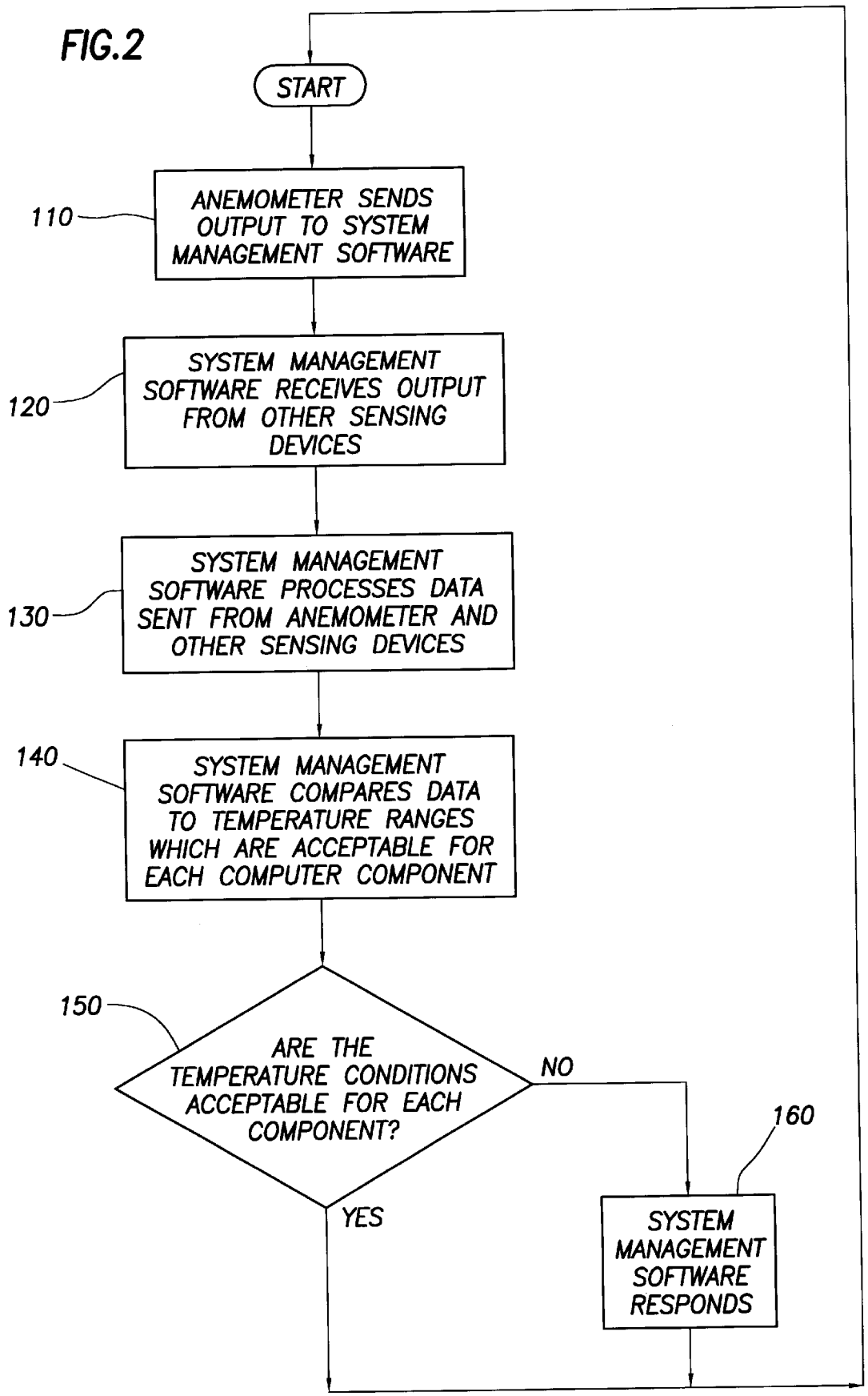

APPARATUS AND METHOD FOR DETECTING COOLING CONDITIONS IN A COMPUTER

TECHNICAL FIELD

The present invention relates in general to the field of computer systems and more specifically to detecting unfavorable cooling conditions within a computer system.

BACKGROUND

Systems management is the installation, configuration, monitoring and maintenance of a computer system, including the hardware, the operating system and the application programs. As businesses continue to integrate computers into their day-to-day operations, their computer systems, such as LAN or workgroup networks, become increasingly complex and extensive and, as a result, systems management becomes more important.

Systems management software is used to facilitate systems management by overseeing all aspects of a business computer system including hardware, networks, operating systems, middle ware, and applications. The goal of systems management software is to reduce the overall cost of operating the business systems. For example, systems management software can allow the systems administrator to install, configure, and manage a large number of computer problems from a central location.

Systems management software focus on several tasks such as configuration management, asset management, problem management and event management. Configuration management enables system administrators to install and update systems and to perform remote configuration tasks. Asset and inventory management is the process of obtaining financial and content information of the systems deployed on the network. Problem management provides a way to isolate system problems and resolve these problems remotely or in an automated fashion.

Event management monitors the health and status of systems on the network. From a remote console, a systems administrator can determine the status of a computer system and take action when a particular event occurs. This function is implemented by instrumentation, a software layer that allows system management software to interact directly with the computer system hardware. This allows a system administrator to service components such as hard-disk drives, memory and other computer system hardware before the component actually fails. For example, if a computer system has a fan that is slowing down below a predetermined threshold, the system management software reports the event, allowing the administrator to dispatch a technician to repair the fan before it fails. The system management software can report events to the system administrator by delivering messages in any number of ways such as a graphical interface, by electronic mail, or by alphanumeric pages.

One important factor in maintaining a computer system is the regulation of thermal conditions inside the computer chassis. If the thermal conditions are unfavorable, then the functionality of the computer system components can be adversely affected. Systems management software can help a system administrator monitor the thermal conditions inside the chassis of each computer or server in the computer system. Sensing devices placed inside the chassis can measure the thermal conditions of the interior and relay this information to the system management software. The system management software can then determine whether of not the thermal conditions are satisfactory or require technical support. However, the system management software depends on the sensing devices to determine whether the system administrator needs to be alerted to unfavorable thermal conditions.

Currently, systems management software use sensing devices which measure the speed of the chassis fans and the chassis temperature. However, this data is insufficient for the system management software to determine several important cooling conditions inside the chassis. For example, users may need to calculate thermal conditions for high-temperature components. Another important condition is the quality of air drawn through the chassis. Merely knowing the temperature or fan speed inside the chassis may not give an accurate assessment of the air quality or dust buildup inside the chassis. Given the importance of maintaining proper thermal conditions inside a computer system, an apparatus or method needs to be implemented with system management software to reliably determine whether or not there is adequate system cooling inside the chassis.

SUMMARY

In accordance with teachings of the present disclosure, a system and method are described for using one or more anemometers to detect unfavorable conditions inside a computer system.

According to one aspect of the present disclosure, an anemometer is mounted inside the chassis of a computer system and is electronically connected to system management software so that the measurements made by the anemometer can be collected and processed by the system management software. The system management software sets a predetermined value for the minimum acceptable speed of airflow through the computer system. This predetermined value is based on the minimum air speed that is necessary for avoiding unfavorable conditions inside the computer system, such as overheating and the accumulation of dust. If the anemometer gives a measurement for air speed that falls below or approaches this predetermined value, the system management software will generate an appropriate response, such as alerting the system administrator.

In another embodiment of the present disclosure, more than one anemometer is mounted inside the computer system. Each anemometer can be located near a particular computer component, such as a fan, processor or digital storage device. Anemometers may also be placed in areas inside the computer system where problems with adequate airflow are suspected or known to exist.

In another embodiment of the present disclosure, one or more anemometers are used with other sensing devices which are also electronically connected with the system management software. In this embodiment, the system management software can process measurements collected from the other sensing devices and compare them to the measurements sent by the anemometers The disclosed system and method provides several technical advantages over conventional approaches for identifying and predicting unfavorable conditions within a computer system. For example, the anemometer allows the system management software to collect additional data regarding the environmental conditions inside the computer system. This additional data allows the system management software to predict problems or identify the source of existing unfavorable conditions more accurately.

In addition, the system management software can utilize the anemometer as a calibration tool and a controlling device. This allows the system management software to establish accurate guidelines for alerting the system administrator to possible problems and to address the problem automatically without the need for immediate intervention by the system administrator or a technician.

Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 1 depicts an embodiment of the present disclosure in a computer system; and FIG. 2 is a flow diagram depicting an embodiment of the present disclosure.

DETAILED DESCRIPTION

Preferred embodiments and their advantages are best understood by reference to FIGS. 1 through 2, wherein like numbers are used to indicate like and corresponding parts.

FIG. 1 depicts the interior of a computer indicated generally at 5, with chassis 10. The computer 5 may be included in a computer system comprising one or more computers electronically connected to form a network. The computer is preferably managed from a central computer or set of computers in the computer system with system management software by one or more system operators. The system management software may be stored on any suitable computer readable medium such as a hard-drive, CD-ROM, memory, magnetic disk drive, floppy disk, or other similar device in the computer 5 or any other computer in the network or computer system.

One or more fans 20 may be installed in the computer 5. These fans 20 are used to pull air into the computer 5 and cool the interior. In order to keep computer components operating within their thermal specifications, it is important to ensure that there is an adequate airflow passing over the components to dissipate heat. This is still important even if there is a thermal solution, such as a heat sink or thermal plate, attached to the component. The fans 20 may be mounted in a variety of locations. For example, fan 20a may be located inside the chassis 10 or fan 20b may be mounted on the chassis. A rotational speed indicator 25 may be mounted on the fan 20 to provide a signal indicating the rotational speed of the blades. The system management software may receive the signals from the rotational speed indicator 25 in order to provide a record of the performance of the fan 20 or to alert the system operator in the event a fan 20 ceases to work satisfactorily. The computer 5 need not have a fan 20 because airflow may be provided in the interior of the computer 5 by convection other means.

The computer 5 may have one or more filters 30 to protect against the buildup of dust and particles that may be brought into the interior of the computer 5 by the activity of the fans 20. The filter 30 may be of any type, such as a conventional permanent air filter.

Mounted inside the computer chassis 10 are several computer components. These computer components may be any type of electronic hardware suitable for implementation in a computer system. For example, these computer components may include any number of mother boards 40, hard drives 50, chips or chip sets 60, and cards 70 mounted on slots 75. The mother board 40 may have several electronic devices mounted on it such as the CPU, heats inks and other components. The hard drive 50 may be a magnetic hard-drive, a CD-ROM, or similar device. The chips or chip sets 60 may include any number of electronic devices including memory, microprocessors, and the like. The cards 70 may include modems, video or audio cards, network cards, and other electronic components which may be mounted on slots 75. These components may be placed in any configuration inside the computer 5. The computer may also include a variety of other electronic or hardware components.

A thermocouple or other temperature sensor 65 may be mounted on the chips or chip sets 60 to measure the surface temperature of the component. One or more temperature sensors 80 may be placed inside the chassis at various locations to determine the temperature inside the computer 5. Temperature sensor 80 may be a thermocouple, thermistor, or RD, for example. The system management software may receive signals from the thermocouples 65 or the temperature sensors 80 in order to record and analyze the thermal conditions inside the computer 5. Other sensors may be mounted inside the computer 5 to measure various conditions and communicate these measurements to the system management software.

One or more anemometers 90 may be mounted inside the chassis 10 of the computer 5. The anemometer 90 may be any device suitable for measuring air flow within the computer chassis 10. For example, the anemometer 90 may be a conventional vane anemometer, wherein the air flow engages the blades of the anemometer and generates an electrical signal corresponding to the velocity of the air flow. The anemometer 90 may also be a hot wire anemometer, wherein voltage is applied to heat a wire which is cooled as air moves across it. The velocity of the air flow may be determined from the amount of energy required to keep the wire at a certain temperature. The anemometer 90 may also be an ultrasonic anemometer. The anemometer 90 may be mechanical, electrical, or any combination thereof.

Any number of anemometers 90 may be positioned inside the computer chassis 10 at various locations. For example, anemometer 90a may be placed directly in the path of the air flow generated by fan 20b. In this location, the anemometer 90a can measure the velocity of the air flow generated by the fan 20b. Although, a rotational speed indicator 25 may be electronically coupled to the fan, the measurements from anemometer 90a may not necessarily be merely cumulative. For example, the anemometer 90a may indicate that the measurement for air flow in its location is below a predetermined acceptable value, but the rotational speed indicator 25 shows that the speed of the blades of fan 20b is adequate. In this situation, the performance of fan 20b is acceptable, but not enough airflow is being generated through the interior of the chassis 10. This may suggest, for example, that a larger than expected computer component has been placed in a position which obstructs the flow of air through the interior of the chassis 10 or that the filter 30 is clogged or dirty. As discussed above, these measurements from the sensing devices may be collected and processed by the system management software. In response to measurements from the various sensing devices that indicate a unfavorable condition, the system management software can alert the system administrator to possible problems in the computer 5. For example, in this situation, the system management software can then notify the system administrator that the filter 30 may be clogged and needs to be cleaned or replaced. If the records indicate that the filter 30 has been changed fairly recently, the system management software may notify the system administrator that the configuration of computer components in the chassis 10 may be resulting in inadequate airflow through the interior of the chassis 10. The combination of the anemometer 90 with other sensing devices in the computer chassis 10 allows the systems management software to analyze additional data and, as a result, more accurately determine the source of the unfavorable conditions inside the computer chassis 10. This allows the system administrator to quickly replace, service or reconfigured the identified computer components and alleviate or remedy the unfavorable conditions within the computer chassis 10.

Anemometers 90 may be placed in proximity to particular computer components for which temperature and adequate airflow is a special concern. For example, anemometer 90b may be placed in proximity to the mother board 40, anemometer 90c can be placed near the chip sets 60, and anemometer 90d may be located next to the cards 70. In these locations, the anemometer 90 can measure the airflow around the component to determine if the convection current is adequate to cool the components and keep them within the prescribed temperature range.

Although a temperature sensor 80 may be located inside the chassis 10 or a temperature sensor, such as a thermocouple 65, may be electronically connected to the chips or chip sets 60, or other computer components, the measurements from the anemometer 90 allows the system management software and the system administrator to "triangulate" the data to help determine the source of the problem. For example, the temperature sensor 80 may indicate that the component is overheating but the rotational speed indicator 25 may show that the fan 20 is operating at an acceptable speed. At this point, the system administrator is alerted to the fact that the particular component is overheating, but he does not know why it is overheating. There can be several reasons for the component overheating. For example, there may be hot or poor airflow over the component, over-voltage, under-voltage, physical failure of the component, among other causes. However, with data from the anemometer 90, the system administrator find, for example, that there is insufficient airflow around the component even though the fan 20 is operating normally. As a result, the system operator has narrowed down the list of possible reasons why the component is overheating. For example, the system administrator knows that the component itself is not defective. Thus, with the additional information from the anemometer 90, the system administrator has "triangulated" to the source of the problem. The system administrator now has a better idea of how to address the problem in a timely and efficient manner.

The anemometer 90 may also be used to verify that the other sensing devices are operating properly. Special care is required to ensure that the thermocouples 60 give an accurate temperature measurement. The thermocouples 60 must be calibrated properly and errors may be introduced if the thermocouple 60 is not handled properly. Measurement errors can arise due to a poor thermal contact between the thermocouple junction and the measured surface, conduction through the thermocouple leads, heat loss by radiation and convection, or by contact between the thermocouple cement and the heats ink base. Similar errors in measurement can arise with other sensing devices. Therefore it is important that the anemometer 90 provide an additional set of data to verify the accuracy of other sensing devices or alert the system administrator to an unfavorable condition which is not indicated by other sensing equipment that may be giving accurate but misleading measurements.

Problems with thermal conditions may arise from poorly placed computer components. If bulky components are placed between the fan and a temperature sensitive component, this component may not receive the airflow necessary to keep the component adequately cooled. For example, in the particular configuration illustrated in FIG. 1, hard drive 50 and cards 70a and 70b may be blocking the airflow generated by fans 20a and 20b from reaching cards 70c and 70d. It would be useful for the technician or system administrator to test a particular configuration of components to determine whether or not each component can be adequately cooled and to find the locations in which cooling may be a problem. In this particular case, anemometer 90d can be used to test whether or not the cards 70c and 70d are receiving sufficient airflow to be kept cool. If the anemometer 90d measures an inadequate airflow, the technician or operator can place the components in different locations to address the problem.

Anemometers 90 may be used in other ways during the configuration process. For example, the system administrator can calculate the minimum acceptable air speed in a particular computer 5, by slowing down the fan 20 until various components have reached their maximum operating temperature. The value measured by the rotational speed indicator 25 can then be input into the system management software for calibration purposes.

The anemometer 90 may also be used to determine whether or not there is an unacceptable accumulation of dust or particles inside the computer chassis 10. Unfavorable thermal conditions may arise because of the accumulation of dust or particles on the various computer components. A layer of dust will decrease the surface cooling of a component and increase the likelihood that the component will overheat. The system management software can compare the measurements from the temperature sensing devices to an acceptable temperature range which has been calculated or measured for a given air flow or fan speed. If the temperature is too high compared to this calibrated temperature range, the system management software can notify the system administrator that an unacceptable accumulation of dust may be a source of the unfavorable temperature conditions.

Sensing devices which are electronically connected to system management software can become controlling devices rather than instruments which simply measure the conditions inside a computer chassis 10. If the sensing device measures an value outside a predetermined range, it can send, via the system management software, a signal to other devices in order to correct the problem. In this case, the anemometer 90 may be used as a controlling device. For example, if the anemometer 90 measures an airflow reading which is below a predetermined level, it can send a signal indicating that the voltage to the appropriate fan 20 must be increased.

FIG. 2 is a flow chart depicting the processing of the output from the anemometer and the other sensory devices by the system management software to determine whether or not the cooling conditions inside the chassis are unfavorable. In step 110 the anemometer or anemometers output an electrical signal to the system management software. As mentioned previously, the system management software may receive the output from several anemometers placed in different locations inside the chassis. Each signal corresponds to the air flow velocity in the particular location in the chassis in which the particular anemometer is located.

In step 120, the system management software receives the outputs from the other sensing devices located in the chassis. These sensing devices include rotational speed indicators for the chassis fans, thermal sensors which may be placed in various locations in the chassis, and other devices for measuring the conditions within the chassis.

In step 130, the air velocity, fan speed, temperature and other measurements are processed by the system management software. At this point thermal calculations may be performed for the various components located in the chassis. Each component has an acceptable range of temperatures in which it can operate without a loss in functionality. For example, most components specify a maximum operating and non operating temperature, a minimum operating and non operating temperature, and a maximum operating and non operating change in temperature. This thermal condition information is stored for each component so that it may be accessed by the system management software.

In step 140, the system management software compares the measurements from the sensing devices to the ranges which are acceptable for the various components. The system management software then makes a determination in step 150 of whether or not the thermal conditions are acceptable for a particular component. If the conditions are not acceptable, the system management software flags this as an "event" or a "problem." Depending on the severity of the conditions, the system management software may send a notice to the system administrator, send a automated command or signal to correct the problem, notify a service technician, or any other suitable response.

The system management software can report events to a system administrator or technician by delivering messages in any number of ways such as through the user interface for the systems management software, by electronic mail, or by an alphanumeric page.

As discussed above, the system management software can alleviate or remedy the problem by sending signals to various devices which are electronically connected to the system management software. For example, the system management software can increase the fan speed if it receives a low air speed measurement from the anemometer. Since most computer systems are designed to run continuously, the system management software can contact a technician or system administrator and send a signal to increase the fan speed in order to compensate for any delay in response by a technician or system operator.

Although the disclosed embodiments have been described in detail, it should be understood that various changes, substitutions and alterations can be made to the embodiments without departing from their spirit and scope.

What is claimed is:

1. A method for detecting unfavorable thermal conditions in a computer, comprising:
   placing an anemometer for measuring air speed at a selected location in the computer;
   providing a range of acceptable values of air speed as measured by the anemometer; and
   providing software for gathering data from the anemometer and outputting a signal responsive to a comparison of data from the anemometer with the range of acceptable values.

2. The method of claim 1 further comprising the steps of
   placing a temperature sensor at a selected location in the computer;
   providing a range of acceptable values of temperature corresponding to values of air speed; and
   providing software to gather data from the temperature sensor and outputting a signal responsive to a comparison of data for air speed and temperature with the range of acceptable values.

3. The method of claim 2 further comprising the step of placing a plurality of temperature sensors at selected locations in the computer.

4. The method of claim 1 wherein the anemometer is mechanical.

5. The method of claim 1 wherein the anemometer is electrical.

6. The method of claim 1 further comprising the step of placing a plurality of anemometers at selected locations in the computer.

7. The method of claim 1
   wherein the software can communicate information to a user, and
   wherein the signal responsive to the comparison of data is information that is communicated to the user.

8. The method of claim 1 further comprising:
   providing a fan at a selected location in the computer, the fan having a rotation speed indicator;
   providing software to gather data from the indicator;
   providing a range of acceptable values of air speed corresponding to values of rotation speed; and
   outputting a signal responsive to a comparison of data for air speed and rotation speed with the range of acceptable values.

9. The method of claim 8,
   wherein the rotation speed of the fan may be adjusted, and
   wherein the responsive signal adjusts the rotation speed of the fan.

10. A method for detecting an accumulation of dust on a selected component of a computer, comprising:
    placing an anemometer for measuring air speed at a selected location in the chassis of the computer and a temperature sensor on or in proximity to the component;
    providing a range of acceptable values of temperature and air speed corresponding to an acceptable accumulation of dust; and
    providing software for gathering data from the anemometer and the temperature sensor and outputting a signal responsive to a comparison of data for air speed and temperature with the range of acceptable values.

11. The method of claim 10 wherein the anemometer is mechanical.

12. The method of claim 10 wherein the anemometer is electrical.

13. The method of claim 10 further comprising the step of placing a plurality of anemometers at selected locations in the computer.

14. The method of claim 10 further comprising the step of placing a plurality of temperature sensors at selected locations in the computer.

15. The method of claim 10,
    wherein the software can communicate information to a user, and
    wherein the signal responsive to the comparison of data is information that is communicated to the user.

16. A computer comprising:
    an anemometer for measuring air speed at a selected location in the computer, wherein the anemometer is communicatively coupled to a computer readable medium storing software for gathering data from the anemometer, wherein the software can produce a comparison of the data received from the anemometer with a range of acceptable values of air speed as measured by the anemometer, and output a signal responsive to the comparison of data from the anemometer with the range of acceptable values.

17. The computer of claim 16 further comprising:

a temperature sensor at a selected location in the computer, wherein the temperature sensor is communicatively coupled to a computer readable medium storing software to gather data from the temperature sensor, wherein the software can produce a comparison of the data received from the temperature sensor to a range of acceptable values of temperature corresponding to values of air speed, and output a signal responsive to the comparison of data for air speed and temperature with the range of acceptable values.

18. The computer of claim 17 further comprising a plurality of temperature sensors at selected locations in the computer.

19. The computer of claim 16 wherein the anemometer is mechanical.

20. The computer of claim 16 wherein the anemometer is electrical.

21. The computer of claim 16 further comprising a plurality of anemometers at selected locations in the computer.

22. The computer of claim 16, wherein the software can communicate information to a user, and wherein the signal responsive to the comparison of data is information that is communicated to the user.

23. The computer of claim 16 further comprising:

a fan at a selected location in the computer, the fan having a rotation speed indicator, wherein the rotation speed indicator is communicatively coupled to a computer readable medium storing software to gather data from the indicator, wherein the software can produce a comparison of the data from the indicator to a range of acceptable values of air speed corresponding to values of rotation speed, and output a signal responsive to the comparison of data for air speed and rotation speed with the range of acceptable values.

24. The computer of claim 23, wherein the rotation speed of the fan may be adjusted, and wherein the responsive signal adjusts the rotation speed of the fan.

\* \* \* \* \*